(12) United States Patent
Vaxelaire

(10) Patent No.: US 11,852,667 B2
(45) Date of Patent: Dec. 26, 2023

(54) DEVICE AND METHOD FOR DETERMINING AN EFFECTIVE PIEZOELECTRIC COEFFICIENT OF A MATERIAL

(71) Applicant: COMMISSARIAT A L'ENERGIE ATOMIQUE ET AUX ENERGIES ALTERNATIVES, Paris (FR)

(72) Inventor: Nicolas Vaxelaire, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/711,877

(22) Filed: Apr. 1, 2022

(65) Prior Publication Data
US 2022/0326291 A1 Oct. 13, 2022

(30) Foreign Application Priority Data
Apr. 9, 2021 (FR) ...................................... 2103635

(51) Int. Cl.
*G01R 29/22* (2006.01)
(52) U.S. Cl.
CPC .................................... *G01R 29/22* (2013.01)
(58) Field of Classification Search
CPC ....... G01N 23/20016; G01N 23/20033; G01N 23/2055; G01R 29/22
USPC ......................................................... 324/727
See application file for complete search history.

(56) References Cited

U.S. PATENT DOCUMENTS

2019/0122782 A1* 4/2019 Pina .......................... G21K 1/06
2020/0357978 A1* 11/2020 Kijima ................. H10N 30/079

OTHER PUBLICATIONS

Thery et al. "Effective piezoelectric coefficient measurement of BaTiO3thin films using the X-ray diffraction technique under electric field available in a standard laboratory" Applied Surface Science 351 (2015), pp. 480-486 (Year: 2015).*
Mazzalai et al. "Characterization and Fatigue of the Converse Piezoelectric Effect in PZT Films for MEMS Applications" J. of Microelectromechanical Sys., vol. 24, No. 4, Aug. 2015, pp. 831-838 (Year: 2015).*
Chidambaram et al. "Converse mode piezoelectric coefficient for lead zirconate titanate thin film with interdigitated electrode", J. Micromech. Microeng. 25 (2015) 045016 (10pp) (Year: 2015).*

(Continued)

*Primary Examiner* — Jermele M Hollington
*Assistant Examiner* — Courtney G McDonnough
(74) *Attorney, Agent, or Firm* — BakerHostetler

(57) ABSTRACT

A device for determining an effective piezoelectric coefficient of a thin film of a material of a sample, includes a source of x-rays incident on the sample; a detector of x-rays diffracted by the sample; a device for positioning the x-ray source and the x-ray detector with respect to the sample; a voltage source making contact with the sample; a device for controlling the voltage source so as to apply an electric field to the sample during an electrical cycle, the electric field generating a strain of the sample and a stress on the sample; a device for measuring a diffraction peak of the x-rays as a function of the electric field applied to the sample during the electrical cycle; a processing device configured to determine the piezoelectric coefficient.

14 Claims, 3 Drawing Sheets

(56) References Cited

OTHER PUBLICATIONS

Thery, et al., "Effective piezoelectric coefficient measurement of BaTiO3 thin films using the X-ray diffraction technique under electric field available in a standard laboratory", Applied Surface Science, vol. 351, pp. 480-486, 2015.

Buzanov, et al., "Measurement of independent piezoelectric constants of a lanthanumgallium silicate family crystals by X-ray diffraction method", 2013 Joint European Frequency and Time Forum & International Frequency Control Symposium (EFTF/IFC), pp. 122-125, 2013.

Blagov, et al., "Measurement of piezoelectric constants of lanthanum-gallium tantalate crystal by X-ray diffraction methods", Crystallography Reports, vol. 58, Issue 1, pp. 49-53, 2013.

Lissalde, et al., "X-ray determination of piezoelectric coefficient in lithium niobate", Ferroelectrics, vol. 14, pp. 579-582, 1976.

\* cited by examiner

DEVICE AND METHOD FOR DETERMINING AN EFFECTIVE PIEZOELECTRIC COEFFICIENT OF A MATERIAL

CROSS-REFERENCE TO RELATED APPLICATION

This application claims priority to foreign French patent application No. FR 2103635, filed on Apr. 9, 2021, the disclosure of which is incorporated by reference in its entirety.

FIELD OF THE INVENTION

The invention is applicable to the technical field of piezoelectric measurements, and more specifically to the technical field of experimental determination of piezoelectric coefficients. The invention relates to a device and method for determining an effective transverse and longitudinal piezoelectric coefficient of a material of a sample.

BACKGROUND

The piezoelectric effect results from coupling between mechanical effects and electrical effects. Certain materials have the property of polarizing under the effect of a mechanical stress; this is the direct piezoelectric effect. This polarization changes sign with the stress. The piezoelectric effect is reversible and, thus, these materials deform under the effect of an electrical bias resulting from application of an electric field; this is the inverse effect.

Piezoelectricity is the ability of a material to become polarized under the action of a stress (direct effect) or in contrast to deform when a field is applied thereto (inverse effect). This is due to the presence in the crystal lattice of atoms of different electronegativity.

The piezoelectricity of a material is characterized by piezoelectric coefficients, which are obtained from matrix expressions that model its electromagnetic properties. The most commonly used piezoelectric coefficient, $d_{ij}$, is, as regards the direct effect, the ratio of the surface charge generated per unit of mechanical stress applied $$\left(d_{ij} = \frac{D_i}{T_{ij}}\right),$$

and, as regards the inverse effect, the ratio of the strain to the electric field $$\left(d_{ij} = \frac{S_j}{E_i}\right).$$

The physical quantities and notations associated with the equations are collated in the table below:

| Type | Symbol | Meaning | Units |
|---|---|---|---|
| Electrical | D | Electric displacement or induction | $C \cdot m^{-2}$ |
|  | E | Electric field | $V \cdot m^{-1}$ |
|  | ε | Electric permittivity | $F \cdot m^{-1}$ |
| Mechanical | S | Relative strain | — |
|  | T | Stress | $N \cdot m^{-2}$ |
|  | s | Compliance | $m^2 \cdot N$ |
| Piezoelectric | d | Piezoelectric coefficients | $C \cdot N^{-1}$ (direct) or $m \cdot V^{-1}$ (inverse) |

In the above formulae, the coefficients are expressed with the Voigt notation, which indicates the polarization direction and the direction of the mechanical stress, along the i and j axes, respectively. There are two main modes of deformation, which are schematically illustrated in FIG. 1, the arrow representing the polarization axis: the longitudinal mode and the transverse mode. In the first case, the directions of the polarization and of the mechanical stress are identical (left-hand part of FIG. 1) and the resulting coefficient, which is called the longitudinal piezoelectric coefficient, is denoted d33. In the second, the directions are perpendicular (right-hand part of FIG. 1) and the piezoelectric coefficient, which is called the transverse piezoelectric coefficient, is written e31.

The longitudinal or transverse piezoelectric coefficient (d33 or e31) is a key parameter in the qualification of a new material, film or process with regard to subsequent integration thereof into actuators, MEMS sensors or radiofrequency (RF) devices. For example, in nitrides such as aluminium nitride (AlN), the longitudinal piezoelectric coefficient is low, about 5 pm/V, making it very tricky to determine experimentally. Moreover, from a metrological and process-inspection point of view, a high-throughput technique for verifying these piezoelectric coefficients on the scale of a wafer would be desirable.

Regarding measurements of piezoelectric coefficient on thin films, the prior art essentially proposes three solutions.

The first prior-art solution, which is the oldest and the most widely used, is the so-called Berlincourt technique. It is based on the direct piezoelectric effect: a force is applied to the sample. The corresponding coefficient d33 is deduced by measuring the electric charge generated. This technique is not very precise for thin films and it is subject to many artefacts.

The second prior-art solution is known by the abbreviation LDV, which stands for laser Doppler vibrometers. Mainly used in the case of MEMS, the LDV technique is a technique that measures the total displacement of the device. This measurement is carried out in reflection. Thus, a local curvature may corrupt the result.

Lastly, a third prior-art solution is the optical interferometry technique referred to as DBLI (for double-beam laser interferometry). At the present time, this technique is probably the most robust approach for thin films. Here, in a sample having an MIM capacitor geometry (metal/piezoelectric film/metal), the total movement of the capacitor is measured as a function of the applied bias. The piezoelectric coefficient is then deduced from the curve representing the total movement as a function of the bias. To avoid artefacts related to curvature of the wafer, the lower and upper positions of the sample are measured simultaneously by virtue of the double beam. However, this technique requires the use of samples both sides of which must be polished to reflect the two laser beams used.

SUMMARY OF THE INVENTION

The invention aims to mitigate all or some of the aforementioned problems by providing a new device, and method, for determining piezoelectric coefficients that is highly sensitive, i.e. very precise, but that neither requires both sides of the sample to be polished nor is affected by local curvature of the sample.

The solution of the invention is thus able to precisely determine longitudinal and transverse piezoelectric coefficients of a material.

One subject of the invention is a device for determining at least one effective transverse piezoelectric coefficient of a thin film of a material of a sample, characterized in that it comprises:

a source of x-rays incident on the sample;
a detector of x-rays diffracted by the sample;
a device for positioning the x-ray source and the x-ray detector with respect to the sample;
a voltage source making contact with the sample;
a device for controlling the voltage source so as to apply an electric field to the sample during an electrical cycle, the electric field generating a strain of the sample and a stress on the sample;
a device for measuring a diffraction peak of the x-rays as a function of the electric field applied to the sample during the electrical cycle;
a processing device configured to determine the transverse piezoelectric coefficient via determination of a radius of curvature of the sample on the basis of the measured diffraction peak.

According to one particular aspect of the invention, the device further comprises a monochromator and a collimator that are coupled to the x-ray source.

According to one particular aspect of the invention, the x-ray detector is an assembly formed by a collimator and a 0D detector or a 1D or 2D hybrid-pixel detector.

According to one particular aspect of the invention, the positioning device is a goniometer comprising at least a first arm that is rotatable around the sample and a second arm, distinct from the first arm, that is rotatable around the sample, the x-ray source being positioned on the first arm and the x-ray detector being positioned on the second arm.

According to one particular aspect of the invention, the determining device further comprises a thermal chamber in which the sample is positioned.

According to one particular aspect of the invention, the determining device is further configured to determine an effective longitudinal piezoelectric coefficient, the processing device being configured to determine a lattice parameter of the material on the basis of the measured diffraction peak and to compute the effective longitudinal piezoelectric coefficient.

According to one particular aspect of the invention, the processing device is configured to determine the radius of curvature via a rocking curve measured at a plurality of points on the sample.

Another subject of the invention is a method for determining at least one effective transverse piezoelectric coefficient of a thin film of a material of a sample, characterized in that it comprises the following steps:

applying an electric field to the sample during an electrical cycle;
emitting x-rays incident on the sample;
detecting x-rays diffracted by the sample;
measuring a diffraction peak of the x-rays as a function of the electric field applied to the sample during the electrical cycle;
determining a radius of curvature of the sample on the basis of the measured diffraction peak;
computing the effective transverse piezoelectric coefficient.

According to one particular aspect of the invention, the step of applying an electric field comprises applying a plurality of electric-field values, one among the plurality of electric-field values preferably being equal to zero.

According to one particular aspect of the invention, the method further aims to determine an effective longitudinal piezoelectric coefficient. The method further comprises the following steps:

determining a lattice parameter of the material on the basis of the measured diffraction peak,
computing the effective longitudinal piezoelectric coefficient.

According to one particular aspect of the invention, the lattice parameter of the material is determined by applying Bragg's law according to which $2 * d\text{-spacing} * \sin(\theta) = \lambda$, where $\lambda$ is the wavelength of the x-ray beam, $\theta$ is the angle between the incident x-rays and the diffracted x-rays and d-spacing is the lattice parameter.

According to one particular aspect of the invention, the step of computing the effective longitudinal piezoelectric coefficient is carried out according to the equation:

$$d_{33,\mathit{eff}} = (S_3/E_3)$$

where S3 is the strain and E3 the applied electric field, at a temperature T defined beforehand, S3 being computed according to the equation $S3 = \{d\text{-spacing}(E) - d\text{-spacing}(E=0)\}/d\text{-spacing}(E=0)$, where d-spacing(E) is the lattice parameter with application of an electric field E.

According to one particular aspect of the invention, the radius of curvature is determined via a rocking curve measured at a plurality of points on the sample.

According to one particular aspect of the invention, the step of computing the effective transverse piezoelectric coefficient is carried out according to the equation:

$$e_{31,\mathit{eff}} = (T_1/E_3)$$

where T1 is the stress and E3 the applied electric field, at a temperature T defined beforehand, T1 being computed by applying Stoney's equation.

BRIEF DESCRIPTION OF THE DRAWINGS

The invention will be better understood and other advantages will become apparent on reading the detailed description of one embodiment that is given by way of example, which description is illustrated by the appended drawings, in which.

For the sake of clarity, these figures are not all to the same scale. Moreover, in the various figures, elements that are the same have been designated with the same references.

DETAILED DESCRIPTION

Figure 1:
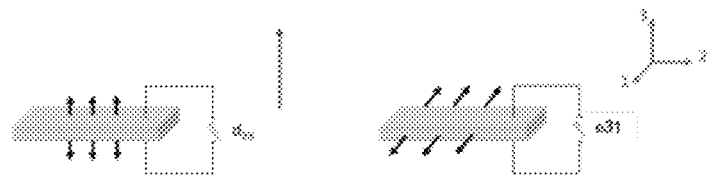
FIG. 1 schematically shows longitudinal and transverse modes of deformation of a piezoelectric material.

FIG. 1 schematically shows longitudinal and transverse modes of deformation of a piezoelectric material. It was presented in the introduction.

Figure 2:
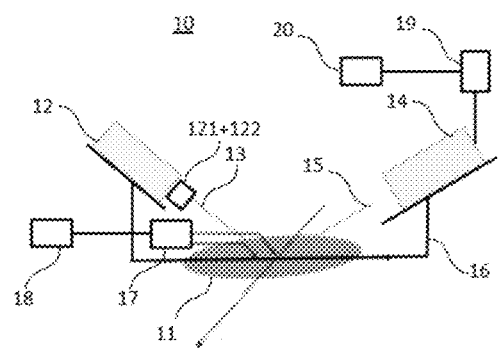
FIG. 2 schematically shows a device for determining an effective piezoelectric coefficient of a material of a sample according to the invention.

FIG. 2 schematically shows a device 10 for determining an effective piezoelectric coefficient of a thin film of a material of a sample according to the invention. The device 10 for determining an effective piezoelectric coefficient of a material of a sample 11 allows the effective transverse and/or longitudinal piezoelectric coefficient e31eff and/or d33eff of a thin film of a material to be determined. The device 10 of the invention comprises a source 12 of x-rays 13 incident on the sample 11 composed of the material the piezoelectric coefficient of which it is desired to determine. It also comprises a detector 14 of x-rays 15 diffracted by the sample 11. Furthermore, the device 10 comprises a device 16 for positioning the x-ray source 12 and the x-ray detector 14 with respect to the sample 11. The device 10 comprises a voltage source 17 that makes contact with the sample 11, and a device 18 for controlling the voltage source 17 so as to apply an electric field to the sample 11 during an electrical cycle, the electric field generating a strain of the sample and a stress on the sample. Lastly, the device 10 comprises a device 19 for measuring an x-ray diffraction peak as a function of the electric field applied to the sample 11 during the electrical cycle, and a processing device 20 configured to determine the piezoelectric coefficient (e31eff and/or d33eff). The processing device 20 will be described in more detail below.

The device 10 for determining an effective piezoelectric coefficient of a material of a sample 11 allows the transverse and/or longitudinal piezoelectric coefficient e31eff and/or d33eff of a material to be determined on the basis of the principle of diffraction of x-rays. The invention is based on a very precise measurement of the crystal-lattice parameter of the material to be characterized over the course of an electrical cycle. This lattice parameter is measured by x-ray diffraction with the device 10. This knowledge allows, after suitable processing, the sought-after effective piezoelectric coefficient e31eff, d33eff to be deduced.

Advantageously, the electric field is applied via two automatic probes that are connected to the voltage source and intended to be connected to the sample to be evaluated. The two probes may for example be spring-mounted and point towards the centre of the positioning device 16. The probes may be translatable in the plane of the sample with a view to positioning them in or withdrawing them from the regions of interest. These probes allow electrical contact to be made to the metal/insulator/metal (MIM) capacitor of which the sample consists.

Advantageously, the positioning device 16 is a goniometer. A goniometer is an apparatus or a sensor that serves to measure angles. In optics, goniometers are used to determine the amount an optical device deviates a light ray. The goniometer comprises a fixed portion, on which a movable portion bearing a sighting lens is mounted. Two configurations are possible: the fixed portion is tied to the frame of reference of the laboratory (Earth's frame of reference), the movable portion pointing in the direction the angle of which to the reference axis it is desired to determine; or else the fixed portion is tied to the frame of reference of the observed object, the movable portion pointing in the reference direction.

In x-ray crystallography, the goniometer is the portion of the diffractometer that serves to determine angles. The movements are motorized.

In most cases, angles are determined by the orders given to the motors (stepper motors): on initialization, the apparatus zeros itself (with respect to a reference point, for example a notch on the goniometer); the angle corresponding to the zero of the motor is determined using an alignment procedure known to those skilled in the art.

In the case of a high-resolution measurement, it takes a long time to stabilize the exact position of the motors (the feedback loop generates oscillations that gradually decrease). In this case, it is more advantageous (time saving) to let the motor position itself approximately, then to measure the angle (automatic measurement, for example using an optical sensor).

Advantageously, the positioning device 16 is a goniometer comprising at least a first arm that is rotatable around the sample 11 and a second arm, distinct from the first arm, that is rotatable around the sample 11, the x-ray source 12 being positioned on the first arm and the x-ray detector 14 being positioned on the second arm. In another embodiment, the stage holding the sample may furthermore be translatable in the plane of the sample to assist with correct positioning of the sample with respect to the source and to the x-ray detector.

In the most general case, it is a question of a goniometer with two circles, which is able to determine the angle of incidence of the x-ray beam on the sample, and the angle between the incident beam and the detected beam, which angle may be called θ. The term "circle" in fact designates a motorization allowing a circular movement.

Advantageously, the determining device 10 according to the invention further comprises a monochromator 121 and a collimator 122 that are coupled to the x-ray source 12. The monochromator 121 is a device used in optics to select a narrower possible range of wavelengths from a light beam containing a broader range of wavelengths. To separate the various wavelengths of a light beam, a monochromator may use either the effect of dispersion of light by a prism, or the effect of diffraction by a grating or by a crystal. An exit slit allows, depending on its position, the wavelength desired in the spectrum that was spread by dispersion to be chosen.

The collimator 122 is an optical device that allows a beam of parallel light rays to be obtained from a light source. Dispersion or diffraction of the light beam is usable only if the light is collimated, i.e. all the light rays are parallel (or practically parallel). In practice, light beams are almost always divergent, and it is necessary to use a collimator 122 to make the rays parallel.

In one embodiment, there is no source of sample bending, i.e. the sample is not subjected to a physical deformation.

In one embodiment, the x-ray detector 14 is an assembly formed by a collimator and a 0D detector or a 1D or 2D hybrid-pixel detector. The 0D detector is a so-called "point detector" that measures an intensity through an entrance window that sees only x-ray photons coming from a given small solid angle. The 1D detector is a one-dimensional linear or curved detector that detects x-rays simultaneously along a line, which is either straight or curved. The 2D detector is a two-dimensional detector that is either flat or cylindrical and that generates a pixelated image in which the intensity contrast corresponds to regions irradiated to a greater or lesser extent by the x-rays diffracted by the sample. A 2D hybrid-pixel detector may be considered to be a matrix array of hundreds of thousands of point detectors operating in parallel and independently.

In another embodiment, the determining device 10 according to the invention may further comprise a thermal chamber in which the sample 11 is positioned. The thermal chamber may be an oven or a cooler and allows the sample to be evaluated to be placed in an atmosphere at a controlled temperature, different from room temperature.

In the case where the piezoelectric coefficient to be determined is the longitudinal piezoelectric coefficient d33eff, the processing device 20 is configured to determine a lattice parameter (d-spacing) of the material on the basis of the measured diffraction peak and to compute the effective longitudinal piezoelectric coefficient d33eff.

In the case where the piezoelectric coefficient to be determined is the transverse piezoelectric coefficient e31eff, the processing device 20 is configured to determine the radius of curvature via a rocking curve measured at a plurality of points on the sample. It will be noted that the processing device 20 may be configured to both determine a lattice parameter (d-spacing) of the material on the basis of the measured diffraction peak and to compute the effective longitudinal piezoelectric coefficient d33eff and to determine the radius of curvature via a rocking curve measured at a plurality of points on the sample.

Figure 3:
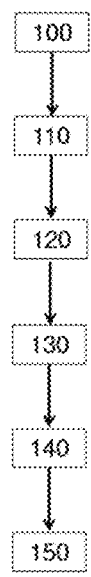
FIG. 3 shows a flowchart illustrating the steps of a method according to the invention.

FIG. 3 shows a flowchart illustrating the steps of a method for determining an effective transverse and/or longitudinal piezoelectric coefficient e31eff and/or d33eff of a material of a thin film of a material of a sample according to the invention. The method comprises the following steps:
- applying (step 100) an electric field to the sample during an electrical cycle;
- emitting (step 110) x-rays incident on the sample;
- detecting (step 120) x-rays diffracted by the sample;
- measuring (step 130) a diffraction peak of the x-rays as a function of the electric field applied to the sample during the electrical cycle;
- determining (step 140) a lattice parameter of the material on the basis of the measured diffraction peak or a radius of curvature of the sample on the basis of the measured diffraction peak;
- computing (step 150) the effective piezoelectric coefficient.

Below, the method for determining an effective piezoelectric coefficient of a material of a sample according to the invention is detailed in the case of the longitudinal piezoelectric coefficient d33eff. However, the same principle applies to the transverse piezoelectric coefficient e31eff, in an analogous fashion that anyone skilled in the art will be able to apply on the basis of the description given here.

Firstly, the sample of the material the longitudinal piezoelectric coefficient of which it is desired to determine, which for example takes the form of a wafer or chip, is placed at the centre of the determining device 10 on the stage that acts as holder, either with a robot or manually.

Thereafter, in the step 100, an electric field is applied to the sample during an electrical cycle. For example, it is possible to employ touch probes that are positioned to apply the potential difference between a lower electrode and an upper electrode of the sample. Alternatively, if the sample is a substrate of doped silicon Si, the handling element may be grounded and there is no need to have a deposited lower electrode. In another alternative, in which a lower electrode is not necessary, it is possible to take measurements on two pads deposited on the sample.

Advantageously, the step 100 of applying an electric field comprises applying a plurality of electric-field values, one among the plurality of electric-field values preferably being equal to zero (in order to allow the device to be calibrated, i.e. when no electric field is applied). For a ferroelectric piezoelectric material, the applied field must not exceed the coercive field of the material.

The steps 110 (emission of x-rays incident on the sample) and 120 (detection of x-rays diffracted by the sample) are carried out simultaneously.

The step 130 of measuring a diffraction peak of the x-rays as a function of the electric field applied to the sample during the electrical cycle follows thereafter. To determine the lattice parameter, called here d-spacing, of the material, the principle of diffraction is used. The measurement is based on local gauges of strain, i.e. crystallites (or coherent domains of diffraction) that contribute to the diffraction signal. These crystallites are small (of the order of 50-100 nm), and measurement thereof allows immunity to the effects of curvature to be achieved. These curvature effects are predominant in the case of thin films and make reliable measurement of piezoelectric coefficients difficult.

For each voltage applied over the course of an electrical cycle, one diffraction peak is measured (step 130). Advantageously, the voltage source is synchronized with the x-ray detector. The measurement may be quasi-statistical (DC) or AC.

Advantageously, the diffraction peak is fitted in order to determine with precision the lattice parameter of the material as a function of the electric field (step 140).

The curve of strain as a function of the applied electric field, S33(E), is lastly fitted by a straight line (step 150). The slope of the straight line gives the sought-after piezoelectric coefficient d33eff.

More precisely, let the fundamental equations of piezoelectricity be expressed:

$$S = s*T + d*E$$

and $$D = \varepsilon*E + d*T$$

with the physical quantities defined in the introduction.

In matrix form, the fundamental equation of piezoelectricity $S = s*T + d*E$ is written:

$$\begin{pmatrix} S_1 \\ S_2 \\ S_3 \\ S_4 \\ S_5 \\ S_6 \end{pmatrix} = \begin{pmatrix} S_{11} & S_{12} & S_{13} & 0 & 0 & 0 \\ S_{12} & S_{11} & S_{13} & 0 & 0 & 0 \\ S_{13} & S_{13} & S_{33} & 0 & 0 & 0 \\ 0 & 0 & 0 & S_{44} & 0 & 0 \\ 0 & 0 & 0 & 0 & S_{44} & 0 \\ 0 & 0 & 0 & 0 & 0 & S_{66} \end{pmatrix} \begin{pmatrix} T_1 \\ T_2 \\ T_3 \\ T_4 \\ T_5 \\ T_6 \end{pmatrix} + \begin{pmatrix} 0 & 0 & d_{31} \\ 0 & 0 & d_{31} \\ 0 & 0 & d_{33} \\ 0 & d_{15} & 0 \\ d_{15} & 0 & 0 \\ 0 & 0 & 0 \end{pmatrix} \begin{pmatrix} E_1 \\ E_2 \\ E_3 \end{pmatrix}$$

In developed form it becomes:

$$S_1 = s_{11}T_1 + s_{12}T_2 + s_{13}T_3 + d_{31}E_3$$

$$S_2 = s_{12}T_1 + s_{11}T_2 + s_{13}T_3 + d31E_3$$

$$S_3 = s_{13}T_1 + s_{13}T_2 + s_{33}T_3 + d33E_3$$

$$S_4 = s_{44}T_4 + d15E_2$$

$S_5 = s_{44}T_5 + d15E_1$ $S_6 = s_{66}T_6$

The following assumptions relative to thin films may be made:

T1=T2 (isotropic biaxial stress, effect of symmetry)

T3=0: free surface (since the surface of the sample is free, there is no stress in the out-of-plane direction)

S1=S2=0 because the film is attached to its stiff substrate (in the case of a film bonded to its much thicker substrate, there is no strain along the axes 1 and 2).

Furthermore, if a field is applied along the z-axis, E=(0, 0, E3), and the following is obtained:

$0 = (s_{11} + s_{12})T_1 + d_{31}E_3$ $S_3 = 2s_{13}T_1 + d33E_3$

The following definition of the effective coefficient d33eff is thus obtained:

$$T_1 = -\frac{d31}{s_{11} + s_{12}}E_3$$

$$S_3 = \left(d33 - 2*d31\frac{s_{13}}{s_{11} + s_{12}}\right)E_3 = d_{33,eff}E_3$$

Thus, d33,eff=E3/S3.

The described diffraction method consists in measuring S3 as a function of E3. Thus, by refining the gradient of the straight line, the effective longitudinal coefficient d33eff is obtained experimentally.

The following relationship defining the effective longitudinal piezoelectric coefficient d33eff that is in practice determined is then obtained:

$d_{33,eff} = (S_3/E_3)/T$ where S3 is the strain and E3 the applied electric field, at a temperature T defined beforehand, S3 being computed according to the equation S3={d-spacing(E)−d-spacing(E=0 V/µm)}/d-spacing(E=0 V/µm), where d-spacing(E) is the lattice parameter with application of an electric field E.

The lattice parameter (d-spacing) of the material is determined by applying Bragg's law according to which 2*d-spacing*sin(θ)=λ, where λ is the wavelength of the x-ray beam, θ is the angle between the incident x-rays and the diffracted x-rays and d-spacing is the lattice parameter.

The determination of a piezoelectric coefficient according to the invention is based on x-ray diffraction. This combination of diffracting and lattice-parameter-determining steps allows the strain S3 to be measured very precisely via a measurement of the lattice parameter of the crystal in the direction of the electric field E3. Thus, the slope of the curve S3(E) is determined experimentally and corresponds by definition to the sought-after effective longitudinal piezoelectric coefficient.

As a result, the determination of the piezoelectric coefficient has a high absolute sensitivity. Depending on the case, the precision of the determination of the coefficient may be as high as one tenth of a pm/V. Low piezoelectric coefficients (and therefore small variations) may be measured. The measurement is based on an average of a statistically large sample of measurements of local strain (crystallites used as strain gauge). Contrary to prior-art solutions, the method of the invention is not based on a macroscopic displacement that is, by nature, subject to greater experimental errors.

The device according to the invention allows immunity to local sample curvatures to be achieved, which curvatures would otherwise result in errors in the values of the obtained piezoelectric coefficients.

The invention also has the advantage that both sides of the samples do not necessarily need to be polished. This double polishing is constraining and required to reflect the two laser beams used in the prior-art DBLI solution.

In addition, sample alignment is simple, contrary to the alignment required in the prior-art DBLI solution. As a result, a high degree of automation is possible, with multiple measurements possible over large regions of interest.

Below, results obtained by implementing the device and method for determining piezoelectric coefficients according to the invention are presented.

Figure 4:
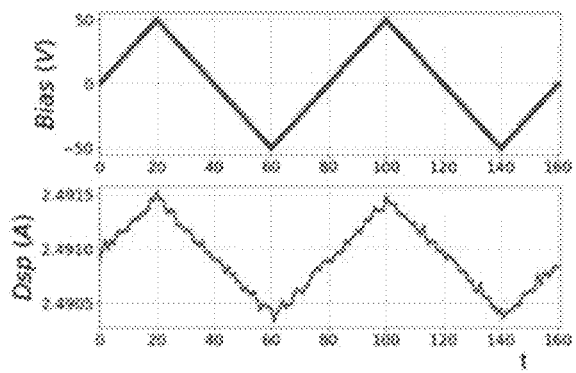
FIG. 4 shows the displacement of the diffraction peak over the course of two triangular electrical cycles of +/−50 V in one example of application of the method according to the invention.

FIG. 4 shows the displacement of the diffraction peak over the course of two triangular electrical cycles of +/−50 V in one example of application of the method according to the invention.

The device and method of the invention have been validated on a model sample. The sample was a thin film of aluminium nitride (AlN) of 1 µm thickness (used for example in radiofrequency applications). As detailed above, a voltage was applied between a lower electrode and an upper electrode (metal/insulator/metal or MIM geometry). Here, rectangular electrodes of 2×8 mm² area were employed. Here, two successive cycles of +/−50 V were applied (top of FIG. 4) to verify the absence of drift. For each of the voltages, the AlN (002) peak was measured by x-ray diffraction in a symmetric coplanar geometry (bottom of FIG. 4) using high-resolution optics. In this geometry, the longitudinal piezoelectric coefficient d33eff was deduced from the curve e33(E) as described above. A value of 4.36 pm/V was obtained. This value is comparable to that of the literature obtained using the optical interferometry technique referred to as DBLI.

Obtainment of the longitudinal piezoelectric coefficient d33eff is based on the ease with which a very precise lattice parameter d-spacing is obtained. The precision of this evaluation will increase as the FWHM of the diffraction peak decreases (with respect to the expected displacement of the peak on application of the electric field). FWHM is the abbreviation of "full width at half maximum", which is an expression of the width of a function. To achieve such, high-resolution optics are recommended. Here, in a way that is advantageous but not absolutely necessary to application of the invention, a collimating multilayer mirror is placed before an asymmetric Bartels monochromator at the exit of the x-ray emitting tube. A 1D detector in static mode is used to take measurements, after two touch probes connecting the capacitor to the external voltage source have been aligned and positioned in a standard manner. The x-ray measurements are then synchronized with the voltage source, which delivers voltages chosen beforehand.

The FWHM of the AlN (002) peak depends on the size of the beam exiting the monochromator. Given that the AlN (002) peak will move 0.007° between E=0 and 50 V/µm, an instrumental width of 0.064°, i.e. a choice of beams of 200 µm, is appropriate, because the measurement is precise to a few fractions of the width of the peak.

Regarding the measurement time, a textured AlN (002) film (common type of film in the envisioned applications) was used. The measurements were carried out such as described above. The AlN film was 1 µm in thickness, and was textured (002) with a mosaicity of 1.5°. It was observed that a measurement lasting 5 seconds was sufficient to obtain an adequate diffraction peak. Given the latency time of the detector, it is possible to take one measurement every 12 seconds. As at least 5 bias points are required, i.e. 0 V, +40 V, +50 V, −40 V, −50 V, a total measurement time of 60 seconds (12 s per scan, with 5 points, i.e. 12×5=60 s) is required to obtain the coefficient d33eff of AlN in this case.

This time of one minute is entirely compatible with an in-line metrological approach to qualifying wafers and measuring many inspection points. It would of course be possible to increase measurement times and the number of voltage points to improve the precision of the measurement.

Figure 5:
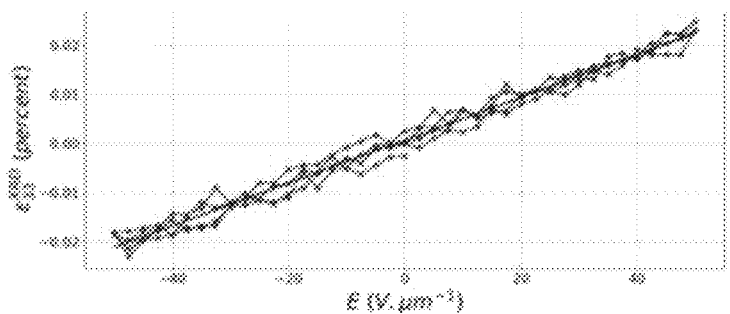
FIG. 5 shows how the effective longitudinal piezoelectric coefficient of a material is evaluated in one example of application of the method according to the invention.

FIG. 5 shows how the effective longitudinal piezoelectric coefficient of a material is evaluated in one example of application of the method according to the invention. It is in fact curves S33(E) of strain as a function of the applied electric field that are shown. These curves have been fitted with a straight line (step 150). The slope of the straight line gives the sought-after piezoelectric coefficient d33eff.

Figure 6:
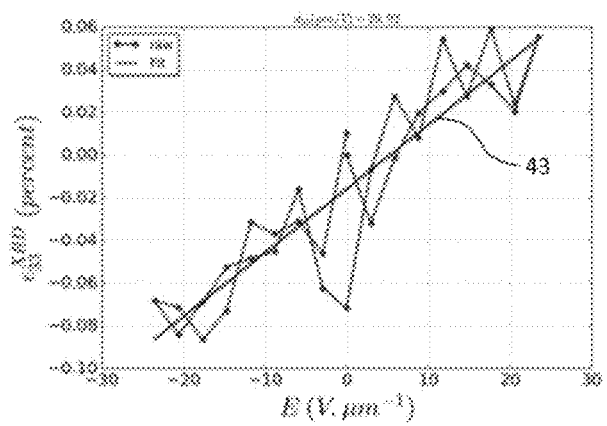
FIG. 6 shows the strain S3 as a function of the electric field applied to the sample, at room temperature, in one example of application of the method according to the invention.

FIG. 6 shows the strain S3 as a function of the electric field applied to the sample, at room temperature, in one example of application of the method according to the invention.

The determination of the longitudinal piezoelectric coefficient d33eff is described here in the case of a thin film of ferroelectric copolymer P(VDF, TrFe). An MIM capacitor composed of conductive electrodes and of a film of P(VDF, TrFe) of 2 μm thickness was deposited on a glass slide.

A measurement of the diffraction peak at about 2θ=20° (for a Cu source of x-rays at 1.54056 angstroms, i.e. 0.154056 nm) and of its variation as a function of the applied electric field allowed, as described above, the slope of the S33(E) curve (referenced 43) in FIG. 6 to be evaluated. In the present case, a longitudinal piezoelectric coefficient d33eff equal to 29.9 pm/V was obtained at room temperature.

Figure 7:
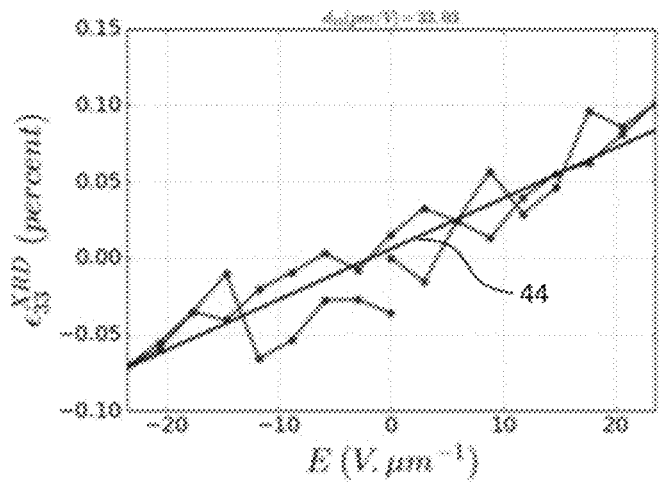
FIG. 7 shows the strain S3 as a function of the electric field applied to the sample, at a temperature of 100° C., in one example of application of the method according to the invention.

FIG. 7 shows the strain S3 as a function of the electric field applied to the sample, at a temperature of 100° C., in one example of application of the method according to the invention.

If a thermal chamber (oven or cooler) is added to the device of the invention, so that the sample may be placed therein, the invention also allows this coefficient to be measured at various temperatures. To demonstrate the feasibility of such a determination, the same sample (thin film of P(VDF, TrFe) ferroelectric copolymer) was used and placed in an oven at 100° C. The determining method of the invention allowed, via determination of the slope of the curve referenced 44, a longitudinal piezoelectric coefficient d33eff equal to 33.03 pm/V at T=100° C. to be determined. These data are in accordance with known values.

The device and method according to the invention allow piezoelectric properties as a function of temperature to be evaluated with a range of application compatible with the automotive field (between −30° C. and +80° C.) or even at lower or higher temperature for the fields of defence, aeronautics and space technology. The invention also enables metrology-type approaches suitable for the microelectronics industry, i.e. it allows piezoelectric coefficient e31eff, d33eff to be tested on silicon substrates in-line and then an x, y map to be generated.

In the case where the piezoelectric coefficient to be determined is the transverse piezoelectric coefficient e31eff, the radius of curvature is determined via a rocking curve measured at a plurality of points on the sample. In the step 130, rays are diffracted from the piezoelectric layer or substrate as a function of the calculated coefficient. A rocking curve is determined at at least three points (the rays diffracted by the substrate are observed).

It will be noted that the radius of curvature may alternatively be measured by laser or vibrometer.

The second fundamental equation of piezoelectricity gives:

$$\begin{cases} T_p = c_{pq}^E S_q - e_{kp} E_k \\ D_i = e_{iq} S_q + e_{ik}^S E_k \end{cases}$$

Making the same assumptions as were made above with respect to a thin film bonded to its stiff substrate, the following is obtained (e31,f in the equations below corresponding to the coefficient e31eff):

$$S_3 = \frac{e_{33}}{c_{33}^E} E_3$$

$$T_1 = T_2 = \frac{c_{13}^E}{c_{33}^E} e_{33} E_3 - e_{31} E_3 = e_{31,f} E_3$$

$$e_{31,f} = e_{31} - \frac{c_{13}^E}{c_{33}^E} e_{33}$$

(It will be noted that e31eff may also be expressed with the coefficient d31:

$$e_{31,f} = \frac{d_{31}}{s_{11}^E + s_{12}^E} = e_{31} + e_{33} \frac{s_{13}^E}{s_{11}^E + s_{12}^E})$$

The following equality is then obtained:

$$T_1 = T_1 = \frac{c_{13}^E}{c_{33}^E} e_{33} E_3 - e_{31} E_3 = e_{31,eff} E_3$$

The step 150 of computing the effective piezoelectric coefficient is then carried out using the equation:

*e*31eff=(*T*1/*E*3)

where T1 is the stress and E3 the applied electric field, at a temperature T defined beforehand, T1 being computed by applying Stoney's equation.

Thus, over an electrical cycle, the field E3 is applied to an electrode that is quite elongate in one direction. For each value of the field E3, the stress T1 is measured via an HRXRD curvature measurement (HRXRD being the abbreviation of high-resolution x-ray diffraction). Next, T1 is plotted as a function of E3 and the slope fitted to obtain the coefficient e31eff.

Figure 8:
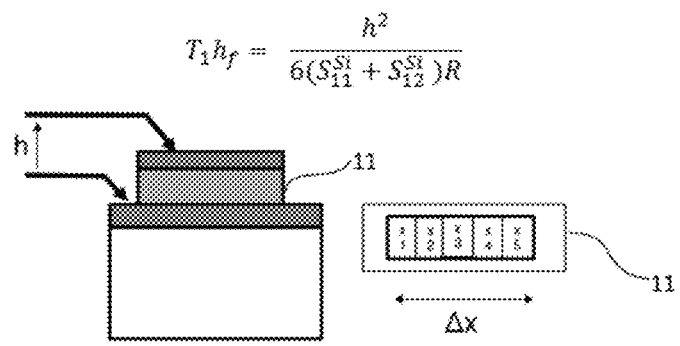
FIG. 8 shows the principle of determining a radius of curvature with a view to determining an effective transverse piezoelectric coefficient of the method according to the invention.
Figure 8:
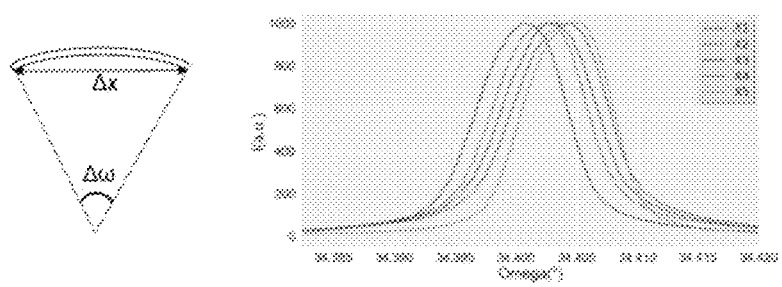

FIG. 8 shows the principle of determining a radius of curvature with a view to determining an effective transverse piezoelectric coefficient of the method according to the invention. This figure aims to illustrate the overall principle of determining the radius of curvature. The sample 11 is placed between a lower electrode and an upper electrode, h being the thickness of the substrate. Measurement probes are placed at a plurality of points on the upper electrode of the sample 11 (there are five in the example of FIG. 8, there could be three thereof, four thereof or even more than five thereof). The equation at the top of FIG. 8 gives the stress T1 as a function of the radius of curvature R and of stiffness S. The rocking curve of the silicon substrate is measured at five points (in the illustrated example). The bottom right-hand graph shows the rocking curves. It is possible to determine the radius of curvature R via the equation given at the bottom of FIG. 8.

Lastly, if the elastic constants are known, on the basis of the coefficients d3,eff and e31eff, it is possible to compute the coefficients d33 and d31.

More generally, it will be appear obvious to those skilled in the art that various modifications may be made to the embodiments described above, in light of the teaching that has just been disclosed. In the following claims, the terms used must not be interpreted as limiting the claims to the embodiments disclosed in the present description, but must be interpreted in such a way as to include therein any equivalent that the claims aim to cover as a result of their wording and provision of which is within the ability of those skilled in the art based on their general knowledge.

The invention claimed is:

1. A device for determining at least one effective transverse piezoelectric coefficient (e31eff) of a thin film of a material of a sample, comprising:
    a source of x-rays incident on the sample;
    a detector of x-rays diffracted by the sample;
    a device for positioning the x-ray source and the x-ray detector with respect to the sample;
    a voltage source making contact with the sample;
    a device for controlling the voltage source so as to apply an electric field to the sample during an electrical cycle, the electric field generating a strain of the sample and a stress on the sample;
    a device for measuring a diffraction peak of the x-rays as a function of the electric field applied to the sample during the electrical cycle;
    a processing device configured to determine the transverse piezoelectric coefficient via determination of a radius of curvature of the sample on the basis of the measured diffraction peak.

2. The determining device according to claim 1, further comprising a monochromator and a collimator that are coupled to the x-ray source.

3. The determining device according to claim 1, wherein the x-ray detector is an assembly formed by a collimator and a 0D detector or a 1D or 2D hybrid-pixel detector.

4. The determining device according to claim 1, wherein the positioning device is a goniometer comprising at least a first arm that is rotatable around the sample and a second arm, distinct from the first arm, that is rotatable around the sample, the x-ray source being positioned on the first arm and the x-ray detector being positioned on the second arm.

5. The determining device according to claim 1, further comprising a thermal chamber in which the sample is positioned.

6. The determining device according to claim 1, further configured to determine an effective longitudinal piezoelectric coefficient (d33eff), wherein the processing device is configured to determine a lattice parameter (d-spacing) of the material on the basis of the measured diffraction peak and to compute the effective longitudinal piezoelectric coefficient (d33eff).

7. The determining device according to claim 1, wherein the processing device is configured to determine the radius of curvature via a rocking curve measured at a plurality of points on the sample.

8. A method for determining at least one effective transverse piezoelectric coefficient (e31eff) of a thin film of a material of a sample, comprising the following steps:
    applying (step 100) an electric field to the sample during an electrical cycle;
    emitting (step 110) x-rays incident on the sample;
    detecting (step 120) x-rays diffracted by the sample;
    measuring (step 130) a diffraction peak of the x-rays as a function of the electric field applied to the sample during the electrical cycle;
    determining (step 140) a radius of curvature of the sample on the basis of the measured diffraction peak;
    computing (step 150) the effective transverse piezoelectric coefficient.

9. The determining method according to claim 8, wherein the step of applying an electric field comprises applying a plurality of electric-field values, one among the plurality of electric-field values preferably being equal to zero.

10. The method according to claim 8, wherein the method further aims to determine an effective longitudinal piezoelectric coefficient (d33eff) and the method further comprises the following steps:
    determining a lattice parameter of the material on the basis of the measured diffraction peak,
    computing (step 150) the effective longitudinal piezoelectric coefficient.

11. The determining method according to claim 10, wherein the lattice parameter of the material is determined by applying Bragg's law according to which $2*d\text{-spacing}*\sin(\theta)=\lambda$, where $\lambda$ is the wavelength of the x-ray beam, $\theta$ is the angle between the incident x-rays and the diffracted x-rays and d-spacing is the lattice parameter.

12. The determining method according to claim 11, wherein the step of computing the effective longitudinal piezoelectric coefficient is carried out according to the equation:

$$d_{33,\text{eff}}=(S_3/E_3)$$

where S3 is the strain and E3 the applied electric field, at a temperature T defined beforehand, S3 being computed according to the equation $S3=\{d\text{-spacing}(E)-d\text{-spacing}(E=0)\}/d\text{-spacing}(E=0)$, where d-spacing(E) is the lattice parameter with application of an electric field E.

13. The determining method according to claim 8, the radius of curvature being determined via a rocking curve measured at a plurality of points on the sample.

14. The determining method according to claim 13, wherein the step of computing the effective transverse piezoelectric coefficient is carried out according to the equation:

$$e_{31,\text{eff}}=(T_1/E_3)$$

where T1 is the stress and E3 the applied electric field, at a temperature T defined beforehand, T1 being computed by applying Stoney's equation.

* * * * *